(12) United States Patent
Bogolea et al.

(10) Patent No.: US 7,541,941 B2
(45) Date of Patent: Jun. 2, 2009

(54) SYSTEM AND METHOD FOR MONITORING AND ESTIMATING ENERGY RESOURCE CONSUMPTION

(75) Inventors: Bradley D. Bogolea, Beaver, PA (US); Patrick J. Boyle, Dallas, PA (US); Andrei V. Shindyapin, Boalsburg, PA (US)

(73) Assignee: Greenbox Technology Inc., San Bruno, CA (US)

( * ) Notice: Subject to any disclaimer, the term of this patent is extended or adjusted under 35 U.S.C. 154(b) by 0 days.

(21) Appl. No.: 11/878,711

(22) Filed: Jul. 26, 2007

(65) Prior Publication Data

US 2008/0224892 A1  Sep. 18, 2008

Related U.S. Application Data

(60) Provisional application No. 60/918,457, filed on Mar. 16, 2007.

(51) Int. Cl.
 *G08B 23/00* (2006.01)
(52) U.S. Cl. ............... 340/870.02; 702/40; 705/412
(58) Field of Classification Search .................
 340/870.02–870.03; 702/60; 705/412
 See application file for complete search history.

(56) References Cited

U.S. PATENT DOCUMENTS

| | | | |
|---|---|---|---|
| 4,350,980 A | 9/1982 | Ward | |
| 4,401,943 A | 8/1983 | Morris | 324/157 |
| 4,644,320 A | 2/1987 | Carr et al. | 340/310 A |
| 5,287,287 A | 2/1994 | Chamberlain et al. | 364/483 |
| 5,635,895 A | 6/1997 | Murr | |
| 6,226,600 B1 | 5/2001 | Rodenberg et al. | 702/61 |
| 6,956,500 B1 | 10/2005 | Ducharme et al. | |
| 7,043,380 B2 | 5/2006 | Rodenberg et al. | 702/62 |

(Continued)

FOREIGN PATENT DOCUMENTS

WO    01/06432 A1    1/2001

(Continued)

OTHER PUBLICATIONS

Primen Final Report on California Information Display Pilot Technology Assessment; Dec. 21, 2004.

*Primary Examiner*—Albert K Wong
(74) *Attorney, Agent, or Firm*—Innovation Partners; Charles E. Gotlieb

(57) ABSTRACT

The present invention discloses a system for monitoring and estimating the consumption of energy resources in real-time. The system includes an interactive user module, a measuring unit and a wireless network. The measuring unit is interfaced to a utility meter. Optionally, the measuring unit can also function as a stand alone device. The measuring unit is further connected to the interactive user module via the wireless network. The system monitors energy resource consumption such as electricity, gas or water consumption in real-time, generates and displays graphs of energy resource consumption over user selected time periods and enables communication with at least one utility company. The system increases the users' awareness of their energy consumption and aids users in dynamic or deregulated pricing environments to shed load when the energy resource is most expensive. With knowledge of their energy use, the users can take proactive steps to control their energy consumption and save money. A method of estimating the energy resource consumption over a period of time is also provided.

7 Claims, 10 Drawing Sheets

U.S. PATENT DOCUMENTS 7,317,404 B2 * 1/2008 Cumeralto et al. ..... 340/870.02

FOREIGN PATENT DOCUMENTS

| WO | 01/15099 A1 | 3/2001 |
| WO | 02/084309 A1 | 10/2002 |
| WO | 03/030509 A1 | 4/2003 |
| WO | 2004/114496 A1 | 12/2004 |

* cited by examiner

FIGURE 5

SYSTEM AND METHOD FOR MONITORING AND ESTIMATING ENERGY RESOURCE CONSUMPTION

This application claims priority to U.S. provisional Application No. 60/918,457, filed on Mar. 16, 2007, which is expressly incorporated herein by reference.

BACKGROUND OF THE INVENTION

Energy efficiency and conservation is becoming increasingly important because demand for energy is relentlessly growing while the dominant energy supplies in the form of various types of fossil fuels are steadily dwindling. Energy costs will continue to grow with time, causing a greater impact to both household and commercial budgets. Due to dependence on fossil fuels, energy production also is adversely affecting the environment by releasing carbon dioxide gas, which contributes to global warming. Studies have shown that when users are made aware of their electricity consumption, they reduce their consumption by up to 25%. When users understand their energy consumption, they conserve, but few commercially available products provide this empowering information.

Over 90% of the electricity generated in the US in 2005 came from nonrenewable sources, including 71.4% from fossil fuels, while only 8.8% was generated using renewable energy, with increased costs of 7% for electricity, 37.9% for natural gas, and 13.2% for coal. Congress has proposed a mandate of 20% of electricity to be from renewable sources by 2020, and utilities, municipalities, and states may face large fines if goals are not accomplished. If total consumption is reduced, the available renewable energy supply becomes a larger percentage of the generated supply, making this goal more obtainable.

Energy efficiency researchers have concluded that the 30-40% of energy use cannot be directly eliminated through technological advances. EnergyStar agrees, estimating that 30% of the energy consumed in buildings is used unnecessarily or inefficiently. Other resource consumption can be reduced through monitoring technologies as well, such as natural gas, where 12% was saved in a 1989 study. The best solution for reducing energy use is through behavioral changes by users, and these are enabled through monitoring and control technologies, which increase user knowledge and promote actions to conserve. Display technologies that report consumption, cost, supply, and other information are one way to accomplish this.

In 2004, an Energy Display Pilot was conducted to determine how reporting affects behavior, including evaluations of currently available products that provided such reporting. This pilot found that:

§ the reduction is more effective when consumption information is presented quickly to users;

§ cost savings with in-home displays is from 4-15% in flat-rate areas and higher in areas with variable pricing;

§ savings do not necessarily remain after device removal; and

§ there are no suitable devices on the market to interface with utility real-time pricing.

Unfortunately, most of the energy monitoring technologies estimate total consumption by extrapolating the current real-time use indefinitely, resulting in widely differing estimates depending on if HVAC, furnaces, water heaters, and other electrical devices are currently running.

BRIEF SUMMARY OF THE INVENTION

The present invention improves this estimation so the user better understands the changes they make without creating "false hopes" of monetary savings. Providing this information on a display that is flexible in display arrangement allows each user to view it in the most helpful manner. The present invention uses one such display solves the problems listed above by providing information to users immediately, maximizes the cost savings in both flat-rate and real-time pricing areas, and is inexpensive enough to leave permanently deployed in buildings.

Utilities are interested in providing systems to customers to help conserve the energy they generate because there is a business-based need to manage peak demand periods that typically occur for a couple of hours a few times a year. This causes utilities to purchase energy from other utility companies or build additional peak generation capacity, which is extremely expensive and goes unused most of the time. If the tip of the demand curve is flattened due to proactive consumer response, generation capacity can be more effectively utilized, saving utilities and consumers money. It is actually cheaper for utilities to conserve energy than to build capacity: building power plants to meet peak demand costs $600 per kilowatt of capacity, while conserving the same energy costs only $100 per kilowatt.

Utilities are using demand response along with Advanced Metering Infrastructure (AMI) and Automatic Meter Reading (AMR) to lower operating costs and limit the amount of increased generation they will have to prepare for in the future. The present invention can communicate directly with "smart" meters such as those using AMI or AMR, eliminating the need to retrofit the meter or building. Once AMI and AMR technologies increase in use, water and gas meters can easily be integrated into the system, allowing all household consumption to be recorded, analyzed, and viewed on a single display. The present invention can meet current and future needs in energy monitoring.

Many of the products currently available in the market use power-line communications, but poor reliability and limiting display locations to areas near wall outlets can hurt the visibility and, therefore, the effectiveness of such systems. The present invention solves this issue by utilizing IEEE 802.15.4/ZigBee/Bluetooth/WiFi radio for low cost, low power communications, which is more reliable and secure than power-line without limiting display locations and is inter operable with new AMR/AMI meters.

BRIEF DESCRIPTION OF DRAWINGS

FIG. 5 shows numerous exemplary status screens of an embodiment of the energy resource monitoring system.

DETAILED DESCRIPTION OF THE INVENTION

The present disclosure puts forward a system for monitoring and estimating energy resource consumption in real time. The system involves the integration of a utility meter for energy resource consumption measurement. The system graphs the energy resource consumption in real time, estimates the cost of energy resource consumption and shows the instantaneous cost of energy resources being consumed. A method for estimating the costs of energy resource consumption over a period of time has also been disclosed as an embodiment of the present invention. Numerous variations and modifications within the spirit of the present invention will of course occur to those of ordinary skill in the art in view of the embodiments that have now been disclosed. However, these variations and modifications should not be considered as a limiting factor to the scope of the present invention.

Figure 1:
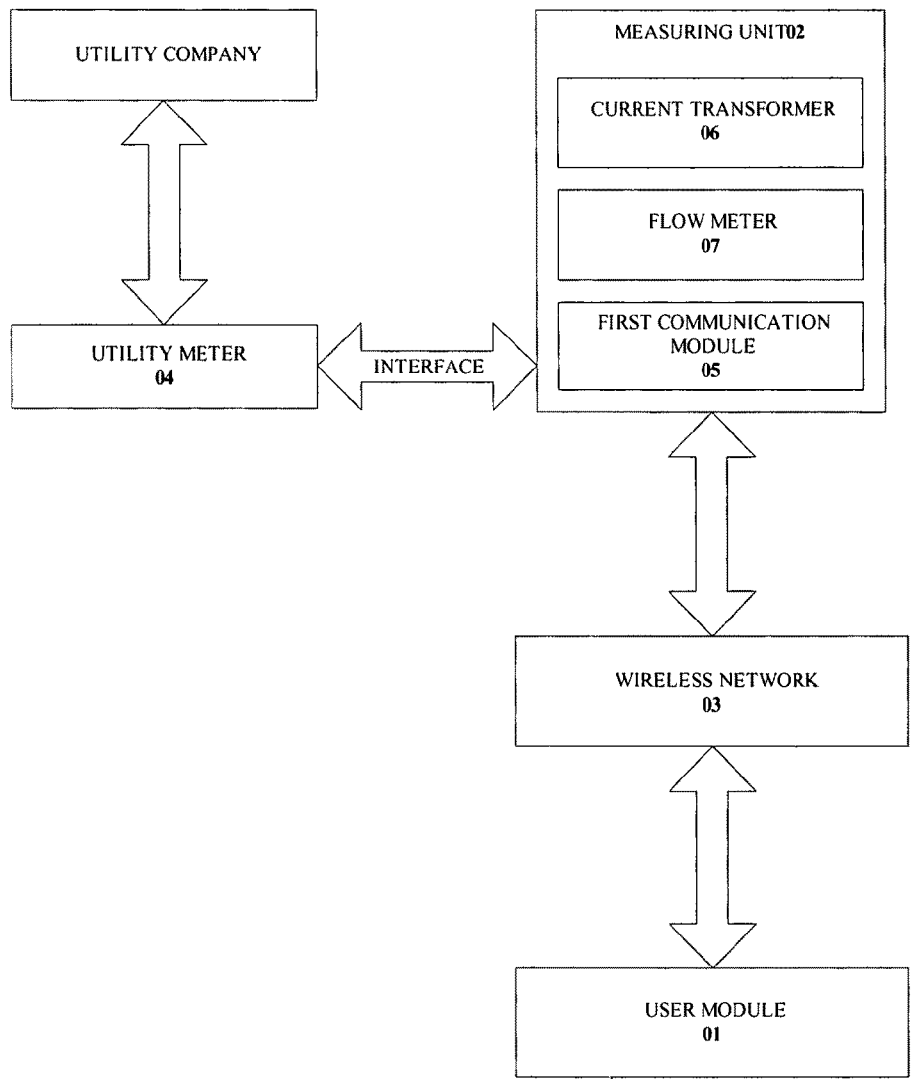
FIG. 1 shows block diagram of a system for monitoring and estimating energy resource consumption according to an embodiment of the invention.

FIG. 1 shows a block diagram of the system for monitoring and estimating the consumption of energy resources in real time, as an embodiment of the present invention. The system comprises of a user module 01, a measuring unit 02 and a wireless network 03. The user module 01 is capable of two-way communication with the measuring unit 02 via the wireless network 03. The measuring unit 02 is interfaced to a utility meter 04 and therefore capable of receiving data from at least one utility company. The wireless network 03 comprises of ZigBee, IEEE 802.15.4, Bluetooth or WiFi. However, other wireless network 03 technologies other than those described here can be used, as might be apparent to the person skilled in the art.

In one embodiment of the present invention, the utility meter 04 is an electricity meter. The measuring unit 02 reads the consumption of electricity in real time and feeds the electricity consumption information to the user module 01. The user module 01 processes the electricity consumption information and displays to the user. The user can thus monitor the electricity consumption in real time. When the electricity consumption level exceeds a certain user-defined level, the user module 01 activates an alarm to notify the user. The user can thus initiate load shedding to control the electricity consumption level and save money.

The measuring unit 02 comprises of a first communication module 05, the first communication module 05 being capable of two-way communication with the user module 01 via the wireless network 03. The first communication module 05 is additionally capable of receiving data from at least one utility company. The first communication module 05 is further capable of receiving data from an information gateway. Additionally, the first communication module 05 can also receive data from at least one demand response technology. The data received by the first communication module 05 comprises of, but not limited to, energy prices, energy supply quality, billing information, energy security information, user alerts and marketing information.

The measuring unit 02 further comprises of at least one current transformer 06. Additionally, the measuring unit 02 also includes at least one flow meter 07. The measuring unit 02 performs the function of measuring the energy resource consumption in real time. The energy resources comprise of electricity, water and gas. However, other energy resources can also be measured by the measuring unit 02, without affecting the scope of the present invention. The measuring unit 02 can optionally be made capable of analyzing the load signatures of electrical devices to determine which electrical devices are currently drawing power.

In another embodiment of the present invention, the utility meter 04 is a water meter. The measuring unit 02 reads the consumption of water in real time through utilization of the flow meter 07 and feeds the water consumption information to the user module 01. The user module 01 processes the water consumption information and displays it to the user. The user can thus monitor the water consumption in real time. When the water consumption exceeds a certain user-defined level, the user module 01 activates an alarm to notify the user.

In yet another embodiment of the present invention, the utility meter 04 is a gas meter. The measuring unit 02 reads the consumption of gas in real time through utilization of the flow meter 07 and feeds the gas consumption information to the user module 01. The user module 01 processes the gas consumption information and displays it to the user. The user can thus monitor the gas consumption in real time. The user module 01 can also calculate the gas emission of the user and thus help in reducing the carbon footprint of the user.

In another embodiment of the present invention, the utility meter 04 is a SMART utility meter 04. The SMART utility meter 04 comprises of AMI (Automatic Metering Infrastructure) and AMR (Automatic Meter Reading) interfaces. The measuring unit 02 is capable of direct interfacing with the SMART utility meter 04. The interfacing can be performed by approaches such as, for example, Communications Over Power Line (COPL), RS 232 and USB. Using the SMART utility meter 04 eliminates the need to retrofit the existing utility meters in a building. This results in a relatively lower installation cost and a lower operating cost for the energy resource consumption monitoring system.

In another embodiment of the invention, the SMART utility meter 04 is integrated directly into the measuring unit 02. This approach eliminates the need for additional interfacing between the measuring unit 02 and the SMART utility meter 04.

In an embodiment of the present invention, an Analog Devices ADE series energy metering chip is used as the measuring unit 02. However, chips from other companies and with similar features can also be used, without limiting the scope of the present invention.

Figure 2:
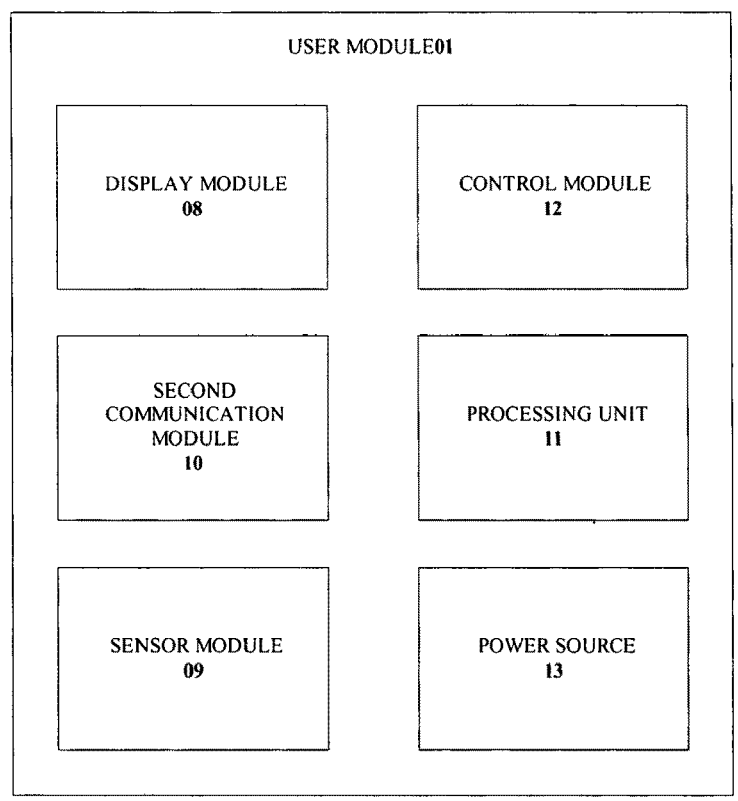
FIG. 2 shows a block diagram of the user module as an embodiment of the invention.

FIG. 2 shows a block diagram of the user module 01, as an embodiment of the present invention. The user module 01 is capable of generating and displaying a graph of energy resource consumption with respect to time. The graph of energy resource consumption with respect to time comprises of energy resource consumption per hour, energy resource consumption per day, energy resource consumption per week, energy resource consumption per month and energy resource consumption per year. The time period for the graph of energy resource consumption can be selected by the user. The user module 01 is further capable of generating and displaying graphs of energy resource usage over elapsed time periods. By way of non-liming example, the elapsed time period can be the last hour, the last day, the last week, the last month or the last year. Additionally, the user module 01 is also capable of generating and displaying the cost of energy resource consumption with respect to time. The cost of energy resource consumption with respect to time can be displayed in a local currency. The user module 01 is further capable of generating and displaying the instantaneous rate of energy resource consumption with respect to time. The instantaneous rate of energy resource consumption with respect to time can be displayed in a standard measurement unit.

In an embodiment of the present invention, the user module 01 is capable of entering into a programmable sleep mode. The programmable sleep mode helps in optimizing the power utilization of the user module 01.

The user module 01 comprises of a display module 08. The display module can include, by way of non-limiting example, Organic Light Emitting Diode (OLED) display, Electronic Ink (E-Ink) display, Caloric Display and Liquid Crystal Display (LCD). The display module 08 is capable of displaying real-time energy resource consumption.

In an embodiment of the invention, an Organic Light Emitting Diode (OLED) display is used as the display module. The OLED display is relatively easy to read and does not require back lights to function. The OLED display uses less power and can be manufactured and integrated into the user module 01 easily. However, other display technologies such as, for example, Liquid Crystal Display (LCD) and Light Emitting Diode (LED) can also be used, without affecting the scope of the present invention.

The user module 01 further comprises a sensor module 09 which includes a motion sensor. The motion sensor senses movement of people in the vicinity of the user module 01, thereby controlling the TURN ON and TURN OFF times of the display module 08. The motion sensor thus helps in optimizing the power consumed by the display module 08. The sensor module 09 further comprises of a temperature sensor. The output of the temperature sensor is processed and displayed to the user on the display module 08. The sensor module 09 can additionally include a humidity sensor. The output of the humidity sensor is processed and displayed to the user on the display module 08. The sensor module 09 optionally includes a light sensor. The output of the light sensor is used to automatically optimize the brightness and contrast levels of the display module 08. The light sensor thus helps in optimizing the power consumed by the display module 08. The sensor module 09 can additionally include a proximity sensor. The output of the proximity sensor can be used to control the TURN ON and TURN OFF times of the display module 08, thereby optimizing the power consumed by the display module 08. As a non-limiting example, the proximity sensor can be an infrared sensor, an infrared transmitter-receiver set or proximity sensing devices using capacitive coupling technique. The proximity sensor can be additionally used to control the sleep mode of the user module 01.

The user module 01 is further capable of sensing and displaying status parameters such as, for example, temperature, humidity, remaining battery life, date, time, communication status and signal strength between the user module 01 and the measuring unit 02.

The user module 01 further includes a second communication module 10. The second communication module 10 is capable of two-way communication with the first communication module 05 via the wireless network 03. The second communication module 10 transmits and receives data from the first communication module 05. As a non-liming example, the data comprises of energy prices, energy supply quality, billing information, energy security information, user alerts and marketing and promotional information. The second communication module 10 is further capable of data communications with an information gateway. Additionally, the second communication module 10 is also capable of data communications with at least one demand response technology. As a non-limiting example, the demand response technology comprises of Open Way, AMR, AMI, OpenAMI, OpenHAN, SmartGrid and IP based networks.

In an embodiment of the present invention, a ZigBee communication module is used as the second communication module 10. The range of wireless communication with an integrated ZigBee communication module is approximately up to 90 meters with direct line of sight and approximately up to 30 meters indoors of a building. However, as a non-limiting factor, other wireless communication technologies such as for example, IEEE 802.15.4, Bluetooth and WiFi can also be used, without affecting the scope of the invention.

The user module 01 further comprises of a processing unit 11. The processing unit 11 accepts data from the sensor module 09 and from the second communication unit. The data is then processed by the processing unit 11 and the results are relayed to the display module 08. The processing unit 11 can also calculate the estimated energy resource consumption with respect to time, with the help of the data received from the second communication module 10. The average cost of energy resource consumption with respect to time can be calculated by the processing unit 11. Additionally the processing unit 11 can also calculate the energy profile of the user from the users' specific utility, the users' energy resource consumption pattern, the amount of renewable energy utilized by the user and the number of carbon offsets purchased by the user.

In an embodiment of the present invention, a MicroChip PIC16 series micro-controller is used as the processing unit 11. However, chips from other companies and with similar features can also be used, without limiting the scope of the present invention.

The processing unit 11 further includes at least one memory module. The memory module is either integrated into the processing unit 11 or can exist as a separate module. The memory module can store user data such as user preferences, historical usage information, energy prices, system settings, and saved user configuration. The memory module can additionally store user authentication information and energy security information. Further, the memory module can also store the amount of renewable energy purchased by the user. If the user is generating renewable energy, then the amount of renewable energy generated by the user can be stored in the memory module. Further, the number of carbon offsets purchased by the user can also be stored in the memory module.

In one embodiment of the present invention, the memory module used is a flash memory. However, memory modules utilizing different storage technologies and having different storage capacities other then those mentioned here can also be used, without limiting the scope of the present invention.

The user module 01 further includes an alarm function whereby the alarm gets activated when at least one user defined condition is reached. As a non-limiting factor, examples of user defined conditions include energy resource consumption limit, gas emission limit, credit limit and energy resource supply limit.

In an embodiment of the present invention, the alarm function is driven by the internal clock of the processing unit 11.

In another embodiment of the present invention, the alarm function is driven by a separate clock circuitry interfaced with the processing unit 11.

In an embodiment of the present invention, the user module 01 further includes a control module 12. The control module 12 comprises of a plurality of buttons for user interaction and control. The buttons can be used to control the alarm function. The buttons can be additionally used to change the display and navigate between different display modes. Optionally, the sleep mode of the user module 01 can be controlled by the buttons.

In another embodiment of the present invention, the control module 12 comprises of a touch screen interface for user interaction and control.

The user module 01 is further comprises a power source 13. In an embodiment of the present invention, the power source 13 comprises of at least one rechargeable battery. The rechargeable battery provides portability to the user module 01 and helps in easy geographical shifting of the user module 01. The user module 01 can be placed anywhere at home or carried around to see the effects of individual appliance loads.

In still another embodiment, the power source 13 comprises of at least one AC to DC transformer. In this case, the user module 01 can be plugged into the standard power outlet available in the walls of a building. The user module 01 can then function as a stand alone module when plugged into the standard power outlet.

In yet another embodiment, the power source 13 comprises of at least one capacitor. Alternately, the power source 13 can be implemented by using harvested energy. The harvested energy can be derived from solar energy, vibration energy or acoustical energy.

In an embodiment of the present invention, the user module 01 is capable of upgrades by using interfaces, such as, but not limited to, serial cable, Universal Serial Bus (USB), Firewire and wireless bootloader program. Interfaces and techniques for single point-upgrades other than those mentioned here may also be used, as might be apparent to the person skilled in the art.

Figure 3:
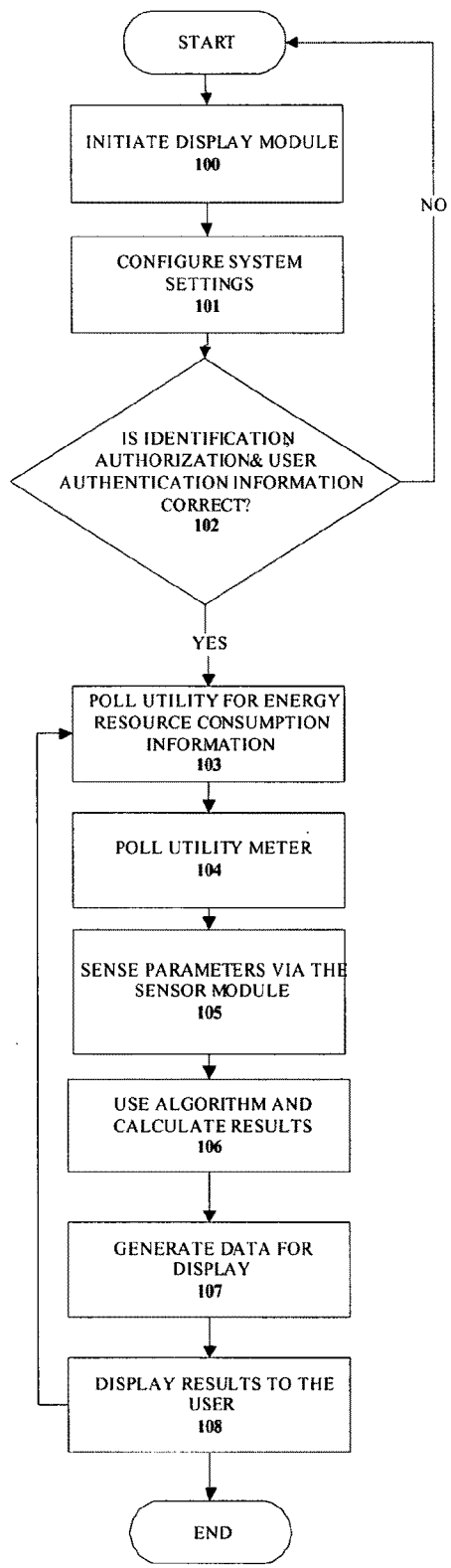
FIG. 3 illustrates the operation steps of the energy resource monitoring system as an embodiment of the invention.

FIG. 3 shows the operation steps of the energy resource monitoring system as an embodiment of the present invention. At step 100, the display module 08 is initiated. Step 101 comprises prompting the user to configure the settings of the user module 01. At step 102, the user module 01 checks if the identification, authorization and user authentication information is correct. If the given information is correct, then the system proceeds to step 103. At step 103, the user module 01 polls the utility for energy resource consumption information. At step 104, the utility meter 04 is polled for the required energy resource consumption information. At step 105, the user module 01 senses the parameters from the sensor module 09, such as for example, temperature and humidity. At step 106, the energy resource consumption information is supplied to an algorithm and the results are calculated. At step 107, the display data is generated from the results. At step 108, the results are displayed to the user on the display module 08.

An embodiment of the present invention comprises using a Consumption Estimation Algorithm (CEA) for estimating the consumption of at least one energy resource over a period of time.

In an embodiment of the present invention, the time period is differentiated into normal days and special days. The normal days comprise of weekdays and workdays. The special days comprise of weekends, holidays and days off from work. A motion senor can be used to detect if a day is a special day. The motion sensor can sense the movement of people in the vicinity of the energy resource monitoring system, thereby deciding if the day is, for example, a workday, a holiday, a weekday, a weekend, or a day off from work.

In an embodiment of the present invention, the CEA is used to estimate the consumption of electricity over a period of time. However, the CEA can be also used to estimate the consumption of energy resources other than electricity, as will be apparent to a person skilled in the art. The application of the disclosed CEA for estimating the consumption of energy resources other than electricity does not in any way limit the scope of the present invention.

Figure 4:
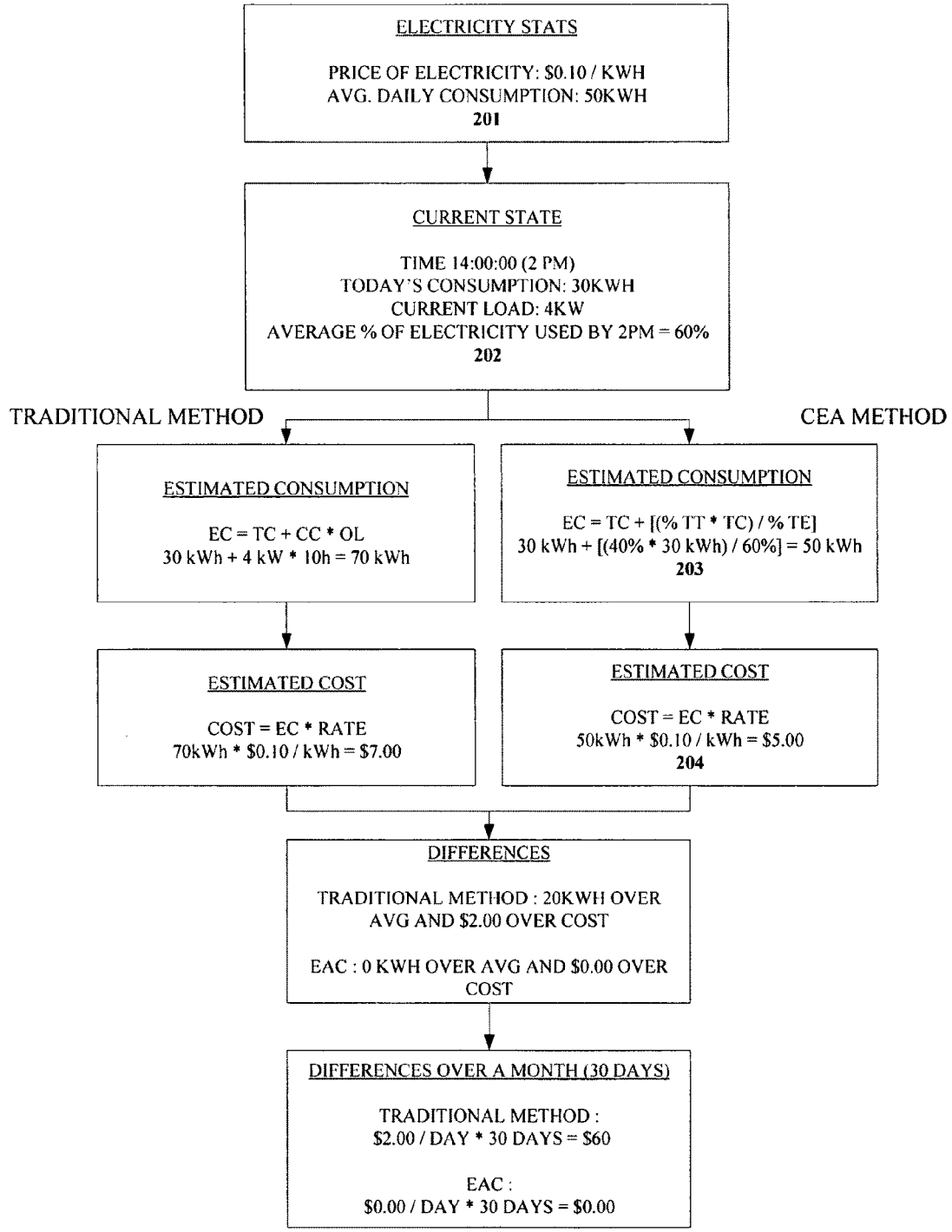
FIG. 4 illustrates the steps involved in the Consumption Estimation Algorithm and the difference between the results of the Consumption Estimation Algorithm and the traditional method of estimating energy resource consumption, according to an embodiment of the invention.

FIG. 4 shows the various steps involved in the CEA and further illustrates the difference between the traditional method of estimating energy resource consumption and the estimation carried out by the disclosed CEA, as an embodiment of the present invention. At step 201, the user module 01 receives the electricity consumption statistics from the measuring unit 02. The electricity consumption statistics include among others, the price of electricity and the average daily consumption of the user. Then at step 202, the current statistics are received from the measuring unit 02. The current statistics include, as a non-limiting example, the current time, today's electricity consumption (TC), the current load, the average percentage of the electricity used till the current time (% TE) and the average percentage of the total electricity used in the remaining hours of the day (% TT). At step 203, the estimated consumption (EC) is calculated using the following relationship:

$$EC = TC + [(\% \ TT * TC)/TE]$$

For example, if today's electricity consumption (TC) is 60 kWh, the average percentage of electricity used till current time (% TE) is 60% and the average percentage of electricity used in the remaining hours of the day (% TT) is 40%, then the estimated consumption (EC) is calculated as:

$$EC = 60 \text{ kWh} + [(40\% * 60 \text{ kWh})/60\%] = 100 \text{ kWh}$$

The traditional method of estimating energy resource consumption results in a 40 kWh difference over average and $0.40 over cost, whereas energy resource consumption estimation by the CEA results in 0 kWh over average and $0.00 over cost.

The differences between the traditional method of estimating energy resource consumption and the estimation carried out by the disclosed Consumption Estimation Algorithm (CEA) when calculated over a 30 day period result in a $12.00 difference, as carried out by the traditional method of estimation. Using the CEA, the difference is $0.00 thereby showing the greater effectiveness and superiority of the CEA over the traditional method of estimating energy resource consumption.

The traditional estimation algorithm is still useful for indicating instantaneous rates such as $XX/hr, since this can indicate immediate changes from turning on/off electrical loads. Extrapolating this information over longer periods of time, such as days, is where problems arise, which can be reduced by employing the disclosed CEA for these longer periods of time.

Figure 5:
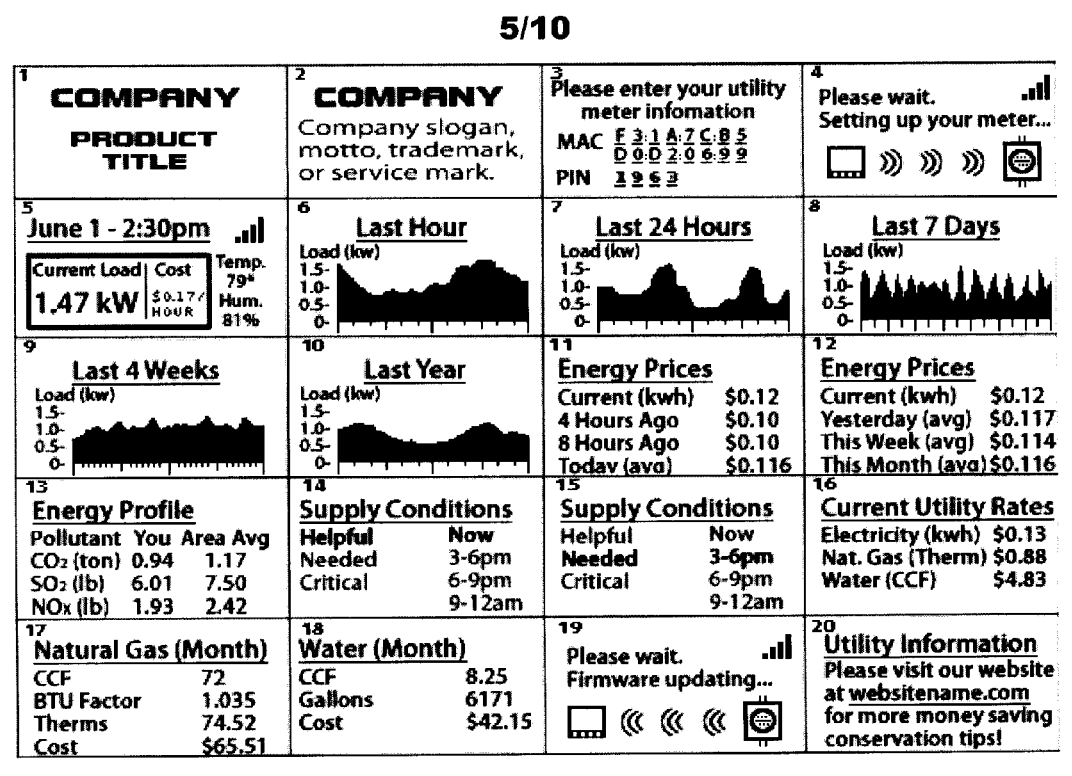

FIG. 5 shows numerous exemplary status screens for the display module 08 as an embodiment of the present invention. Screen shot 1 illustrates the splash screen. An exemplar welcome screen is illustrated in screen shot 2. Screen shot 3 shows the utility meter 04 authentication. Screen shot 4 shows the communication setup between the user module 01 and the utility meter 04. Screen shot 5 is an exemplar main screen displaying current load, cost per hour, time, date, temperature, humidity, and signal strength between the user module 01 and the utility meter 04. Screen shots 6 to 10 are the exemplar graphs showing electrical consumption over the last hour, day, week, month, and year for easy visual analysis and trending, as an embodiment of the present invention. Screen shots 11 and 12 show the current cost of energy and the historical pricing information. Screen shot 13 illustrates the energy profile showing calculated pollutants generated. Screen shots 14 and 15 show the utility supply conditions with level of conservation requested to help maintain a high level of electrical service. If the building has AMR/AMI gas and water meters, consumption and pricing information for those utilities can be viewed as illustrated by screen shots 15 to 18. Screen shot 19 shows the exemplar firmware updates from a utility company. Informational screens directing users towards more useful sources of conservation tips is shown by screen shot 20, as an embodiment of the present invention.

Figure 6:
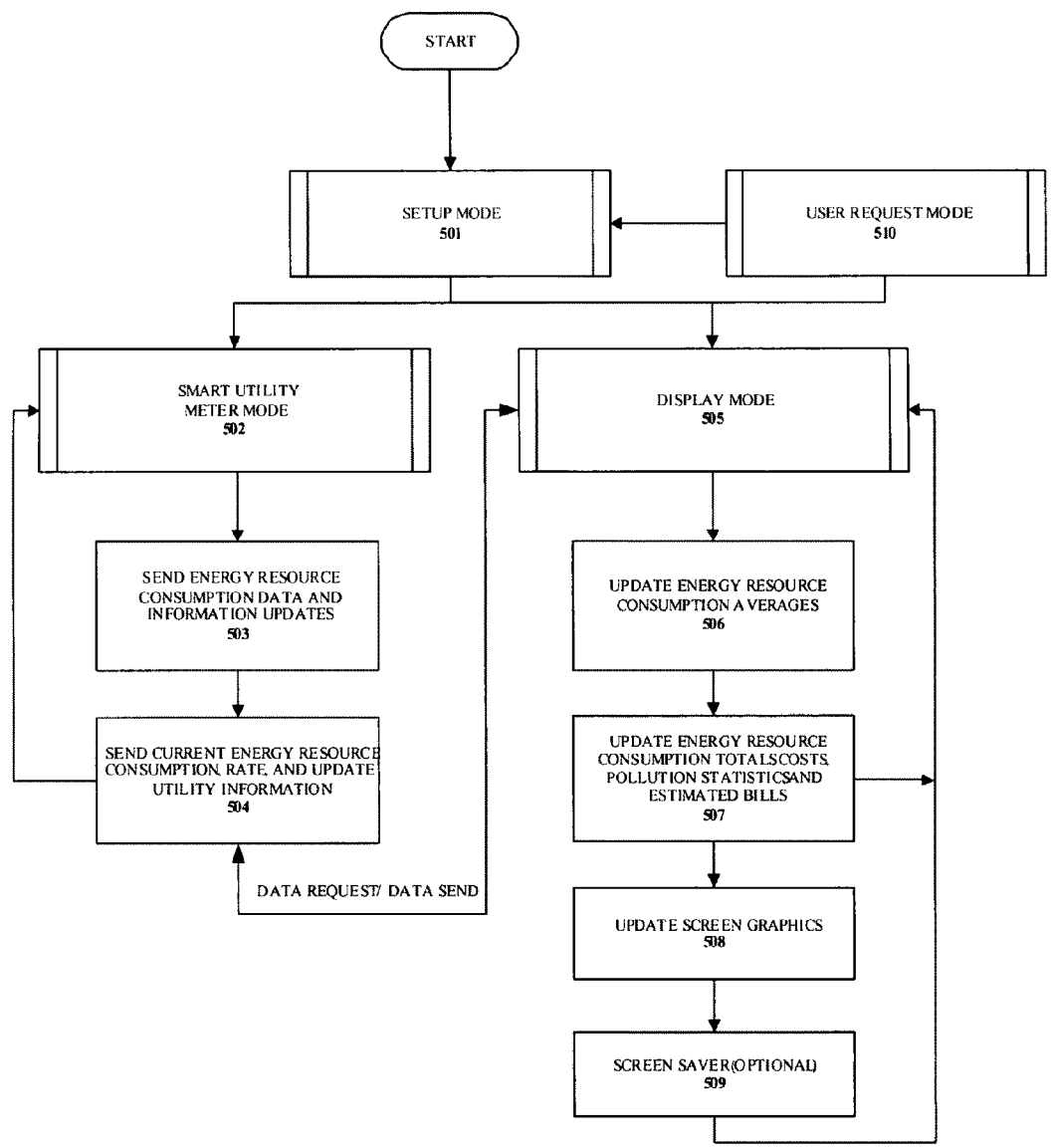
FIG. 6 illustrates the various states and the data flow of an embodiment of the energy resource monitoring system that integrates a SMART utility meter.

FIG. 6 illustrates the various states and the data flow of an embodiment of the energy resource monitoring system that integrates a SMART utility meter 04. In state 501, the system enters into the setup mode. In the setup mode, the user module 01 verifies the transmission and reception with the SMART utility meter 04. The transmission and reception update interval is set along with the date and time in the setup mode. Additionally the TURN ON and TURN OFF times are set for the display module 08 and finally an acknowledgment is received from the SMART utility meter 04 and is displayed on the display module 08. In state 502, the SMART utility meter 04 performs the energy resource consumption measurement. In states 503 and 504, the energy resource consumption data is sent to the user module 01 and the utility information is updated accordingly. In state 505, the user module 01 receives the energy resource consumption data and sends an acknowledgment to the SMART utility meter 04. The energy resource consumption data is then saved into the memory module. In one embodiment of the present invention, a flash memory module is used. The energy resource consumption data includes, but is not limited to, pricing information, energy supply conditions and user alerts. In state 506, the average energy resource consumption over a period of time is calculated by the user module 01 and updated. The time period can be a day, a week, a month or a year. In state 507, the consumption totals, costs, pollution statistics and estimated bills are calculated by the user module 01 and updated. In state 508, the display module 08 is updated with the new energy resource consumption data. In state 509, a screen saver can be optionally displayed on the display module 08. State 510 comprises the user request mode. In the user request mode, the user may interact with the user module 01 by pressing a button. The user can additionally initiate the setup mode and request updates from the SMART utility meter 04. The user can optionally change the display modes of the display module 08 in the user request mode.

Figure 7:
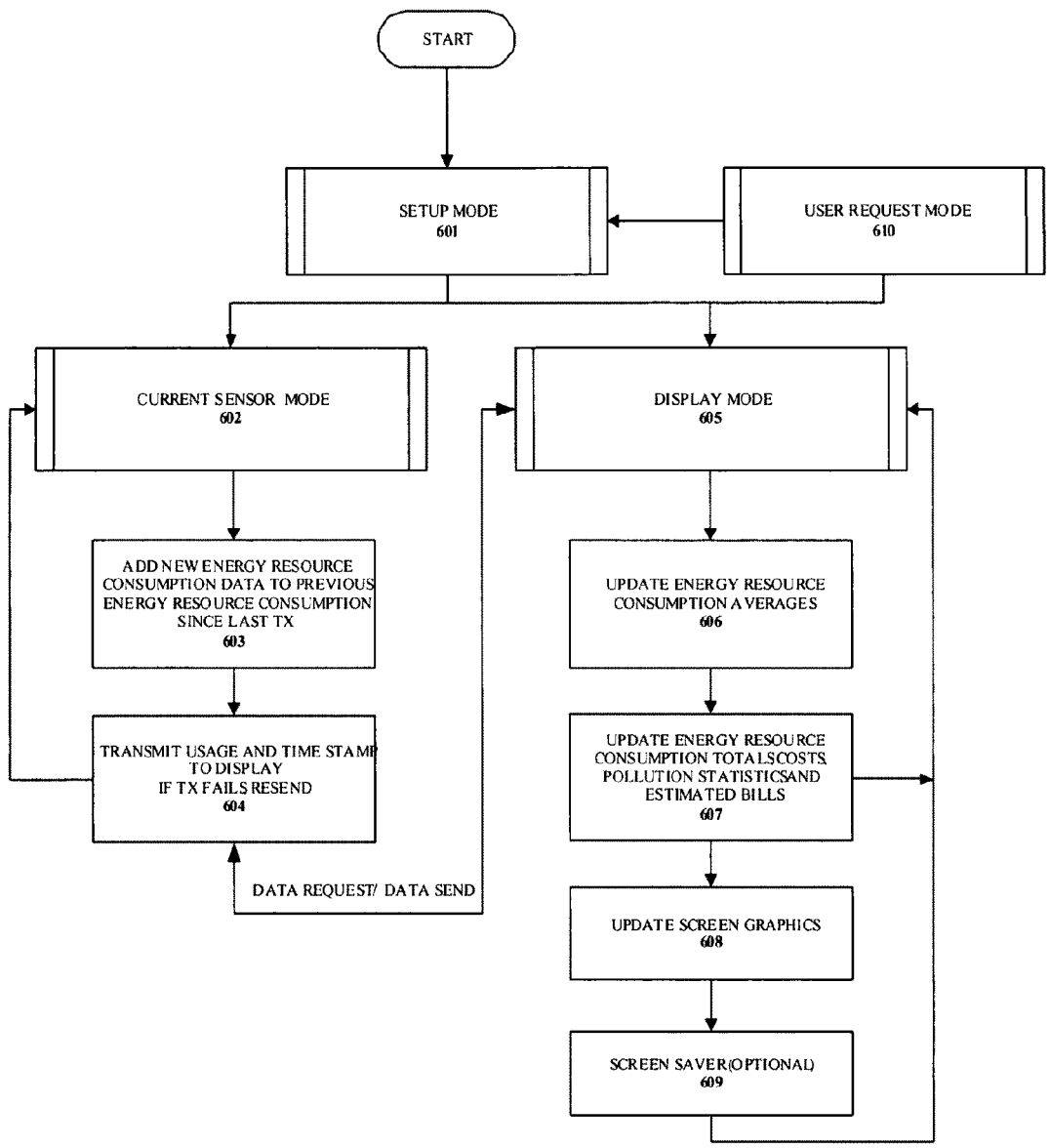
FIG. 7 illustrates the various states and the data flow of an embodiment of the energy resource monitoring system that integrates a regular metering unit for determining energy resource consumption.

FIG. 7 illustrates the various states and the data flow of another embodiment of the energy resource monitoring system that integrates a regular metering unit for determining energy resource consumption. In state 601, the system enters into the setup mode. In the setup mode, the user module 01 verifies the transmission and reception with the measuring unit 02. The transmission and reception update interval is set along with the date and time in the setup mode. Additionally the TURN ON and TURN OFF times are set for the display module 08 and finally an acknowledgment is received from the measuring unit 02 and is displayed on the display module 08. In state 602, the measuring unit 02 performs the current measurements and averages the current measurements over a period of time. In state 603, the new energy resource consumption data is added to the last energy resource consumption data since the last transmission to the user module 01. In state 604, the measuring unit 02 sends the energy resource consumption data to the user module 01. In state 605, the user module 01 receives the energy resource consumption data and sends an acknowledgment to the measuring unit 02. The energy resource consumption data is then saved into the memory module. In one embodiment of the present invention, a flash memory module is used. The energy resource consumption data includes, but is not limited to, pricing information, energy supply conditions and user alerts. In state 606, the average energy resource consumption over a period of time is calculated by the user module 01 and updated. The time period can be a day, a week, a month or a year. In state 607, the consumption totals, costs, pollution statistics and estimated bills are calculated by the user module 01 and updated. In state 608, the display module 08 is updated with the new energy resource consumption data. In state 609, a screen saver can be optionally displayed on the display module 08. State 610 comprises the user request mode. In the user request mode, the user may interact with the user module 01 by pressing a button. The user can additionally initiate the setup mode and request updates from the measuring unit 02. The user can optionally change the display modes of the display module 08 in the user request mode.

Figure 8:
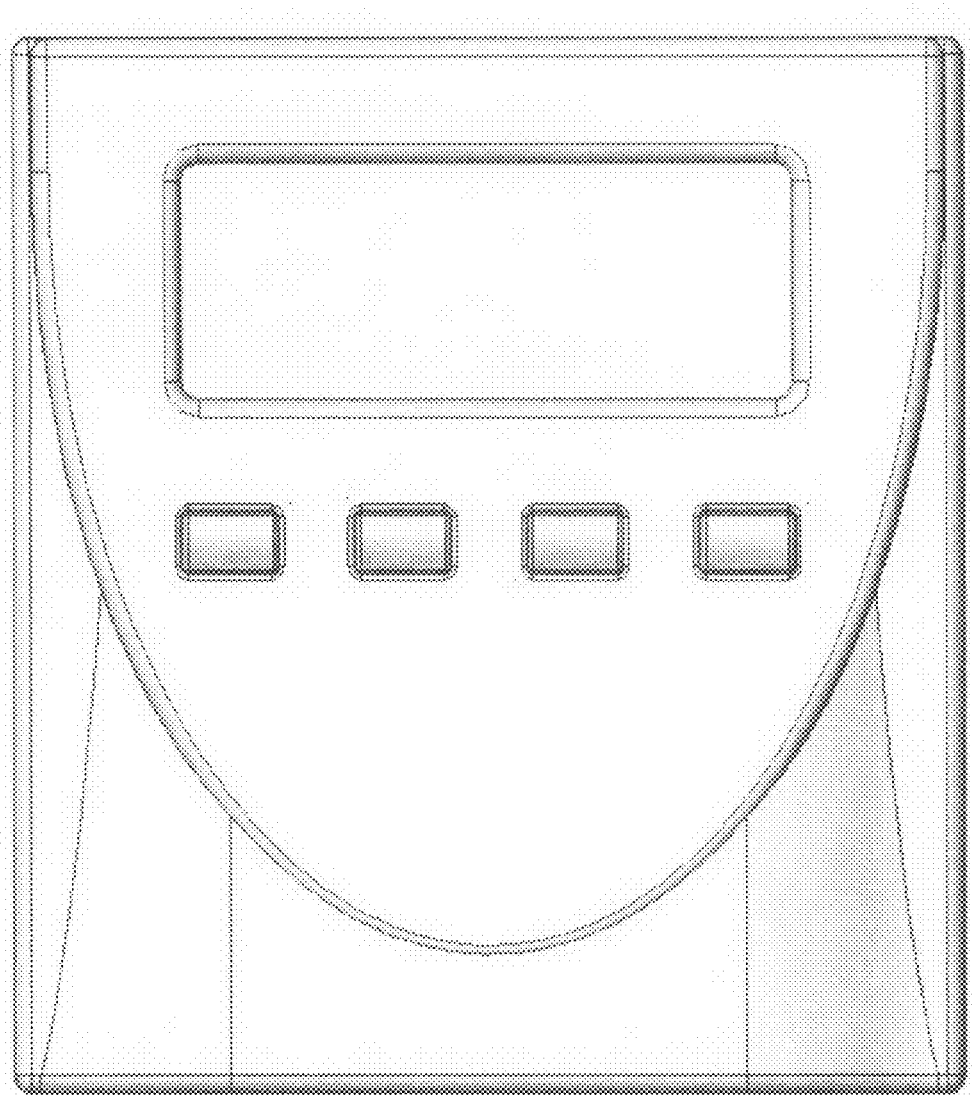
FIG. 8 shows the front panel of an energy resource monitoring system according to an embodiment of the invention.
Figure 9:
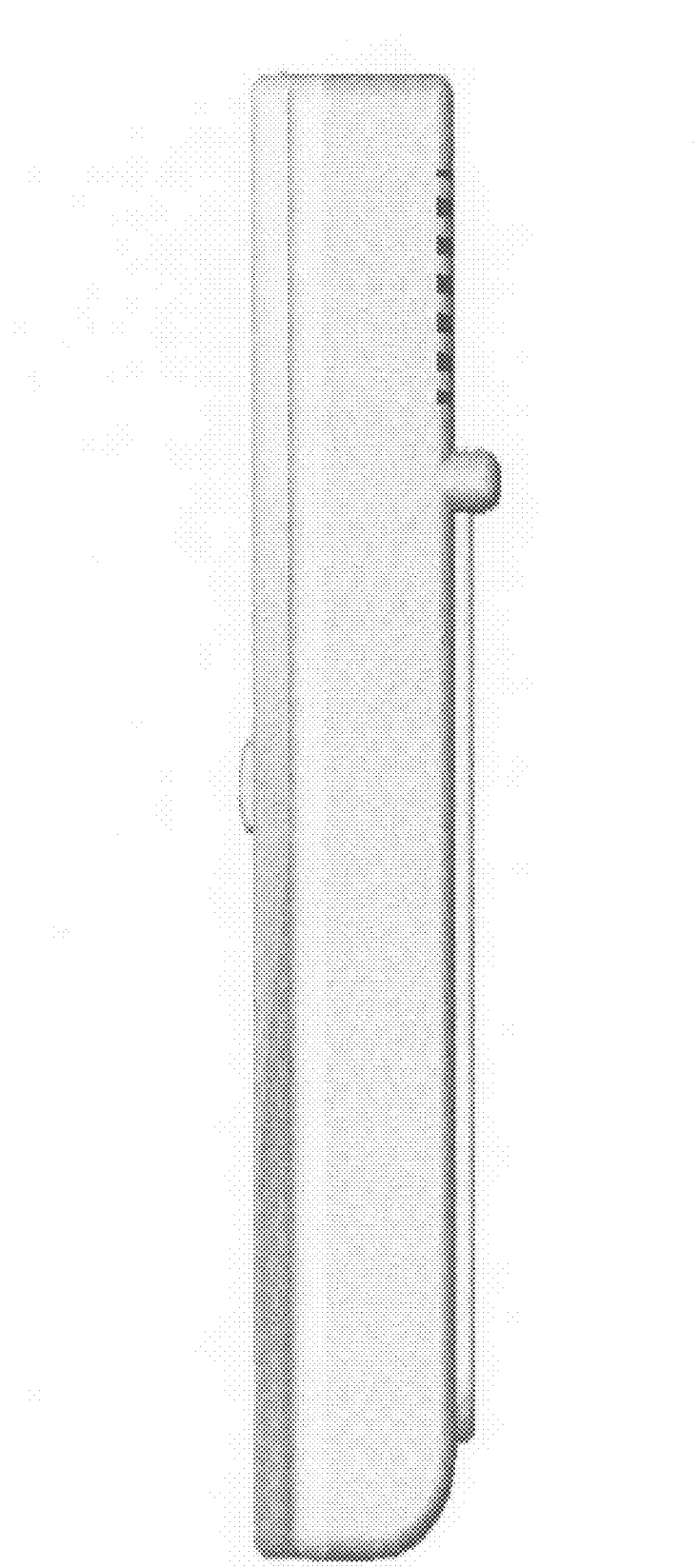
FIG. 9 shows the side view of an energy resource monitoring system according to an embodiment of the invention.
Figure 10:
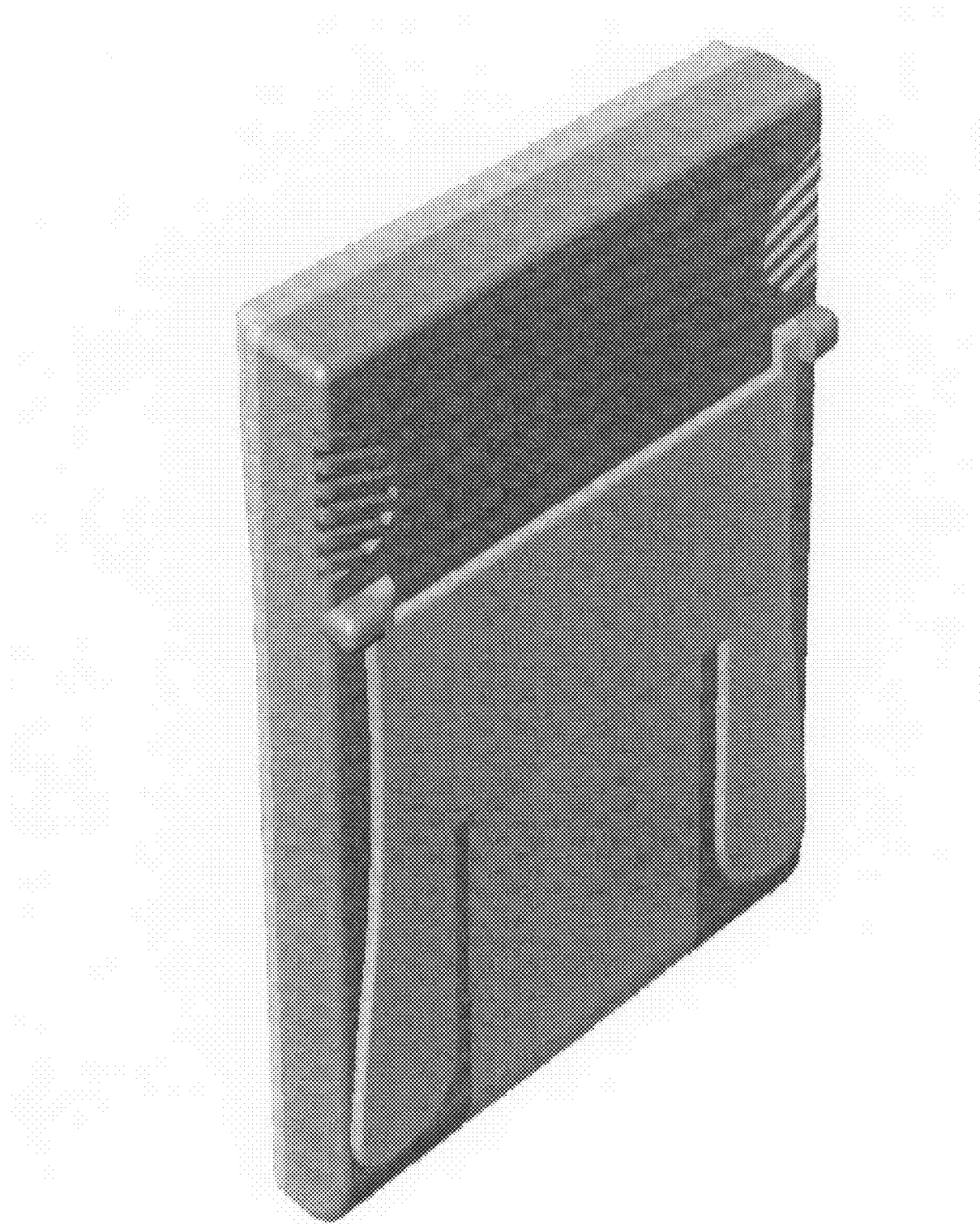
FIG. 10 shows the rear view of an energy resource monitoring system according to an embodiment of the invention.

FIG. 8 shows the front panel of an energy resource monitoring system according to an embodiment of the invention. FIG. 9 shows the side view of an energy resource monitoring system according to an embodiment of the invention. FIG. 10 shows the rear view of an energy resource monitoring system according to an embodiment of the invention.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A method of estimating the consumption of at least one energy resource, the method comprising the steps of:
   (a) obtaining the energy resource consumed by at least one first device over an elapsed time period A;
   (b) obtaining the average percentage of energy resource consumed by the at least one first device over the elapsed time period A;
   (c) obtaining the average percentage of energy resource consumed by the at least one first device in remaining time period B;
   (d) at least one second device, at least one of the at least one second device being different from at least one of the at least one first device:
      (i) multiplying the average percentage of energy resource consumed in remaining time period B with the energy resource consumed over the elapsed time period A;
      (ii) dividing the result obtained in step (i) with the average percentage of energy resource consumed over the elapsed time period A; and
      (iii) adding the result obtained in step (ii) with the energy resource consumed over the elapsed time period A.

2. The method of claim 1, wherein the elapsed time period A is obtained from a measuring unit.

3. The method of claim 1, wherein the remaining time period B is obtained from a measuring unit.

4. The method of claim 1, wherein the elapsed time period A and the remaining time period B are differentiated into normal days and special days.

5. The method of claim 4, wherein the normal days comprise of weekdays and workdays.

6. The method of claim 4, wherein the special days comprise of weekends, holidays and days off from work.

7. The method of claim 4, wherein the differentiation into normal days and special days is provided by a motion sensor.

* * * * *